(12) United States Patent
Vellianitis

(10) Patent No.: US 9,954,077 B2
(45) Date of Patent: Apr. 24, 2018

(54) APPARATUS AND METHOD FOR MULTIPLE GATE TRANSISTORS

(71) Applicant: Taiwan Semiconductor Manufacturing Company, Ltd., Hsin-Chu (TW)

(72) Inventor: Georgios Vellianitis, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 14/841,480

(22) Filed: Aug. 31, 2015

(65) Prior Publication Data
US 2015/0372116 A1  Dec. 24, 2015

Related U.S. Application Data

(62) Division of application No. 13/594,579, filed on Aug. 24, 2012, now abandoned.

(51) Int. Cl.
*H01L 29/66* (2006.01)
*H01L 29/04* (2006.01)
*H01L 29/78* (2006.01)
*H01L 29/10* (2006.01)
*H01L 21/02* (2006.01)
*H01L 21/306* (2006.01)
(Continued)

(52) U.S. Cl.
CPC .. *H01L 29/66636* (2013.01); *H01L 21/02381* (2013.01); *H01L 21/02433* (2013.01); *H01L 21/02532* (2013.01); *H01L 21/02609* (2013.01); *H01L 21/02639* (2013.01); *H01L 21/30604* (2013.01); *H01L 21/30625* (2013.01); *H01L 29/045* (2013.01); *H01L 29/0653* (2013.01); *H01L 29/1054* (2013.01); *H01L 29/165* (2013.01); *H01L 29/66795* (2013.01); *H01L 29/7848* (2013.01); *H01L 29/7853* (2013.01)

(58) Field of Classification Search
CPC ........... H01L 29/7853; H01L 21/02381; H01L 21/0245; H01L 21/02532; H01L 21/2018; H01L 21/30625; H01L 29/1037; H01L 29/165; H01L 29/66795; H01L 29/785
See application file for complete search history.

(56) References Cited

U.S. PATENT DOCUMENTS 8,119,494 B1  2/2012  Vellianitis
2006/0076625 A1  4/2006  Lee et al.
(Continued)

FOREIGN PATENT DOCUMENTS

TW  200807632 A  2/2008

*Primary Examiner* — Kenneth Parker
*Assistant Examiner* — Christopher Culbert
(74) *Attorney, Agent, or Firm* — Slater Matsil, LLP

(57) ABSTRACT

A method comprises etching away an upper portion of a substrate to form a trench between two adjacent isolation regions, wherein the substrate has a first crystal orientation and is formed of a first semiconductor material, growing a first semiconductor region in the trench over the substrate, wherein the first semiconductor region is formed of a second semiconductor material and an upper portion of the first semiconductor region has a second crystal orientation and growing a second semiconductor region over the first semiconductor region, wherein the second semiconductor region is formed of a third semiconductor material.

20 Claims, 21 Drawing Sheets

(51) Int. Cl.
*H01L 29/06* (2006.01)
*H01L 29/165* (2006.01)

(56) References Cited

U.S. PATENT DOCUMENTS

| | | |
|---|---|---|
| 2006/0289905 A1 | 12/2006 | Kito et al. |
| 2007/0252211 A1 | 11/2007 | Yagishita |
| 2007/0267722 A1 | 11/2007 | Lochtefeld et al. |
| 2007/0278585 A1 | 12/2007 | Dyer et al. |
| 2008/0001169 A1 | 1/2008 | Lochtefeld |
| 2008/0073641 A1* | 3/2008 | Cheng .................... B82Y 10/00 257/25 |
| 2011/0117732 A1* | 5/2011 | Bauer ............... H01L 21/02381 438/507 |
| 2011/0147811 A1 | 6/2011 | Kavalieros et al. |
| 2011/0147846 A1 | 6/2011 | Su et al. |
| 2012/0319211 A1* | 12/2012 | van Dal ............ H01L 29/66795 257/401 |
| 2013/0049068 A1 | 2/2013 | Lin et al. |
| 2013/0099282 A1* | 4/2013 | Chen ................. H01L 29/66795 257/190 |
| 2013/0115721 A1* | 5/2013 | Clark ................ H01L 21/02532 438/12 |
| 2013/0307021 A1* | 11/2013 | Ching et al. .... H01L 21/823807 257/190 |
| 2014/0011341 A1* | 1/2014 | Maszara ........... H01L 29/66795 438/478 |

\* cited by examiner

APPARATUS AND METHOD FOR MULTIPLE GATE TRANSISTORS

This application is a divisional of U.S. patent application Ser. No. 13/594,579, entitled "Apparatus and Method for Multiple Gate Transistors," filed on Aug. 24, 2012, which application is incorporated herein by reference.

BACKGROUND

As technologies evolve, semiconductor process nodes have been scaled down for high density integrated circuits. As a result, the form factor of integrated circuit has been improved from shrinking the semiconductor process node (e.g., shrink the process node towards the sub-20 nm node). As semiconductor devices are scaled down, new techniques are needed to maintain the electronic components' performance from one generation to the next. For example, transistors formed by high carrier mobility materials such as III-V materials, germanium and/or the like are desirable for high density and high speed integrated circuits.

Germanium and silicon are group IV elements in the periodic table. In comparison with silicon, germanium is of higher carrier and hole mobility. The higher carrier and hole mobility of germanium may lead to better device electrical properties. For example, the lattice electron mobility of silicon is 1417 $cm^2$/V-sec. In contrast, the lattice electron mobility of germanium is 3900 $cm^2$/V-sec. The electron mobility of germanium is about 2.75 times more than that of silicon. Such higher electron mobility of germanium leads to higher drive current and smaller gate delay. It should be noted that some group III-V materials may be used to replace silicon because some of group III_V materials may have much higher mobility than germanium and silicon.

Another advantageous feature of germanium based transistors is that germanium is of a smaller band gap. More particularly, the band gap of germanium is about 0.6 eV compared to 1.2 eV for silicon. Such a smaller band gap helps to reduce the threshold voltage of germanium based transistors.

Germanium is of various advantages in comparison with silicon. However, silicon wafers are dominant in the semiconductor industry because the cost of germanium wafers is very high. One widely accepted solution of fabricating germanium based transistor is growing germanium active regions on silicon substrates through an epitaxial growth process.

Growing a germanium layer on a silicon substrate is commonly referred to as germanium-silicon hetero-epitaxial growth. The lattice constant of germanium is about 4.2% more than the lattice constant of silicon. When a germanium layer is grown on a silicon substrate, the germanium layer is compressively strained to fit the lattice spacing of the silicon substrate. After the germanium layer is grown more than a critical thickness, the strain may be relieved by forming a variety of threading dislocations. Such threading dislocations are defects, which may degrade electrical properties of germanium based transistors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a germanium based multiple gate transistor. The embodiments of the disclosure may also be applied, however, to a variety of transistors formed of group IV elements, group III-V compounds and group II-VI compounds. Hereinafter, various embodiments will be explained in detail with reference to the accompanying drawings.

Figure 1:
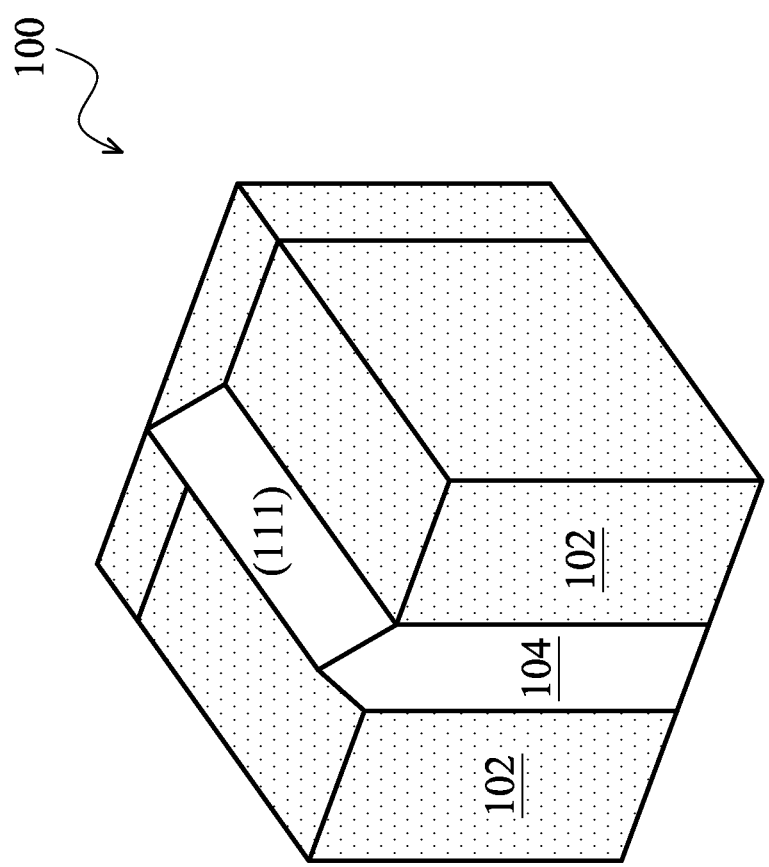
FIG. 1 illustrates a perspective view of an active region of a semiconductor device in accordance with an embodiment.

FIG. 1 illustrates a perspective view of an active region of a semiconductor device in accordance with an embodiment. The semiconductor device 100 includes isolation regions 102 and an active region 104. The active region 104 may be divided into two portions. A bottom portion of the active region 104 is surrounded by the isolation regions 102. An upper portion of the active region 104 is above the top surfaces of the isolation regions 102. More particularly, the upper portion of the active region 104 is of a <111> crystal orientation. The active region 104 may be formed of a semiconductor material selected from the group consisting of group IV elements, group III-V compounds, group II-VI compounds.

It should be noted while FIG. 1 illustrates the active region 104 may be formed of a single semiconductor material, the active region 104 may be formed by a plurality of semiconductor layers stacked together and each of the stacked semiconductor layers may be formed of different semiconductor materials such as group IV elements, group III-V compounds, group II-VI compounds. The detailed formation process of the active region 104 will be described below with respect to FIGS. 3-21.

Figure 2:
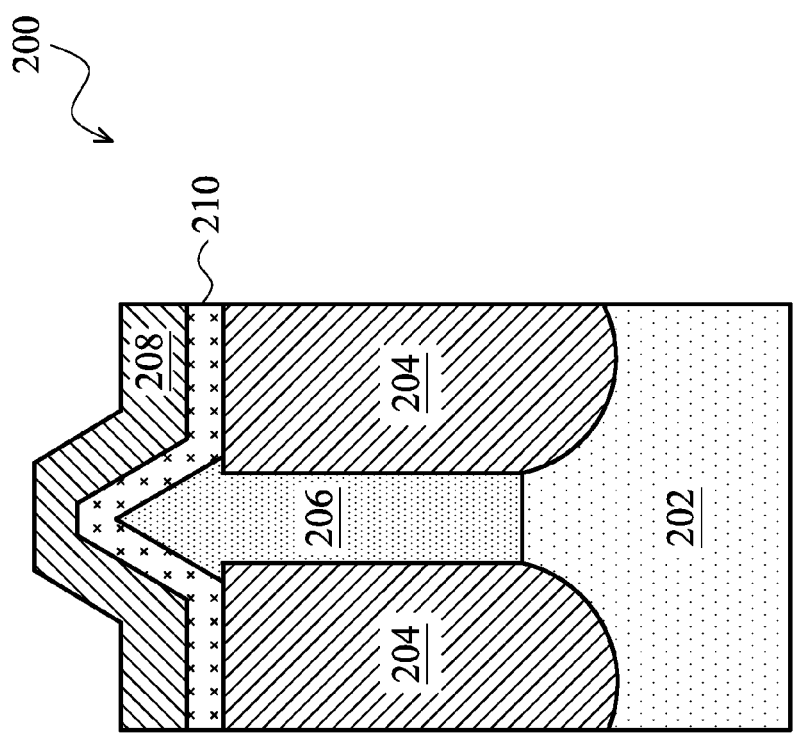
FIG. 2 illustrates a cross sectional view of a multiple-gate transistor in accordance with an embodiment.

FIG. 2 illustrates a cross sectional view of a multiple-gate transistor in accordance with an embodiment. The multiple-gate transistor 200 includes an active region 206, which is similar to that shown in FIG. 1. The active region 206 is grown from the substrate 202. The top portion of the active region 206 protrudes up from the top surfaces of the isolation regions 204 of the multiple-gate transistor 200. The top portion of the active region 206 is triangular in shape from a cross sectional view. In addition, the gate electrode 208 of the multiple-gate transistor 200 wraps the top portion of the active region 206 around two sides. Because the gate electrode 208 wraps two sides of the upper portion of the active region 206, the multiple-gate transistor 200 is also known as a double gate transistor.

As shown in FIG. 2, there may be a gate dielectric layer 210 formed between the gate electrode 208 and the top portion of the active region 202. The top portion of the active region 206 may function as a channel region of the multiple-gate transistor 200. The multiple-gate transistor 200 may further include drain/source regions and spacers (not shown respectively). For simplicity, drain/source regions and spacers are not included in the cross sectional view shown in FIG. 2.

In accordance with an embodiment, the substrate 202 may be a crystalline structure. The substrate 202 may be formed of silicon, although it may also be formed of other group III, group IV, and/or group V elements, such as silicon, germanium, gallium, arsenic, and combinations thereof. In accordance with an embodiment, the substrate 202 may be formed of a first semiconductor material having a first crystal orientation. According to an embodiment, the first semiconductor material is silicon and the first crystal orientation is a <001> crystal orientation.

The active region 206 is formed in a trench over the substrate 202. The structure of the active region 206 has been described in detail above with respect to FIG. 1, and hence is not discussed again herein. It should be noted that the active region 206 may be formed of a second semiconductor material. According to an embodiment, the second semiconductor material is germanium. In addition, the upper portion of the active region 206 is of a second crystal orientation. According to an embodiment, the second crystal orientation is a <111> crystal orientation. One advantageous feature of the semiconductor structure shown in FIG. 2 is that the multiple-gate transistor 200 may be of a <111> crystal orientation at the sidewalls of the active region under the gate. Such a <111> crystal orientation helps to improve the electrical characteristics of the multiple-gate transistor 200.

The multiple-gate transistor 200 may comprise isolation regions 204. As shown in FIG. 2, the bottom portion of the active region 206 is enclosed by the isolation region 204. The isolation region 204 may be implemented by a shallow trench isolation (STI) structure. The STI structure (e.g., isolation regions 204) may be fabricated by using suitable techniques including photolithography and etching processes. In particular, the photolithography and etching processes may comprise depositing a commonly used mask material such as photoresist over the substrate 202, exposing the mask material to a pattern, etching the substrate 202 in accordance with the pattern. In this manner, a plurality of openings may be formed as a result. The openings are then filled with dielectric materials to form the STI structures (e.g., isolation regions 204). In accordance with an embodiment, the isolation regions may be filled with a dielectric material such as an oxide material, a high-density plasma (HDP) oxide or the like. A chemical mechanical polishing (CMP) process is then performed to remove excess portions of the dielectric materials, and the remaining portions are the isolation regions 204.

As shown in FIG. 2, the isolation regions 204 may be portions of a continuous region, which may form an isolation ring in accordance with an embodiment. Alternatively, the isolation regions 204 may be two separate isolation regions having their sidewalls facing each other.

As shown in FIG. 2, there may be a gate dielectric layer 210 formed between the upper portion of the active region 206 and the gate electrode 208. The gate dielectric layer 210 may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer 210 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The high-dielectric material may be deposited through suitable fabrication techniques such as atomic layer deposition (ALD).

The gate electrode 208 may comprise a conductive material selected from a group comprising of polycrystalline-silicon (poly-Si), poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

It should be noted that other fabrication processes may be used to form the gate electrode 208. Other fabrication processes include but is not limited to CVD, physical vapor deposition (PVD), plasma enhanced CVD (PECVD), atmospheric pressure CVD (APCVD), high density plasma CVD (HD CVD), low-pressure chemical vapor deposition (LP-CVD), atomic layer CVD (ALCVD) and the like.

Figure 3:
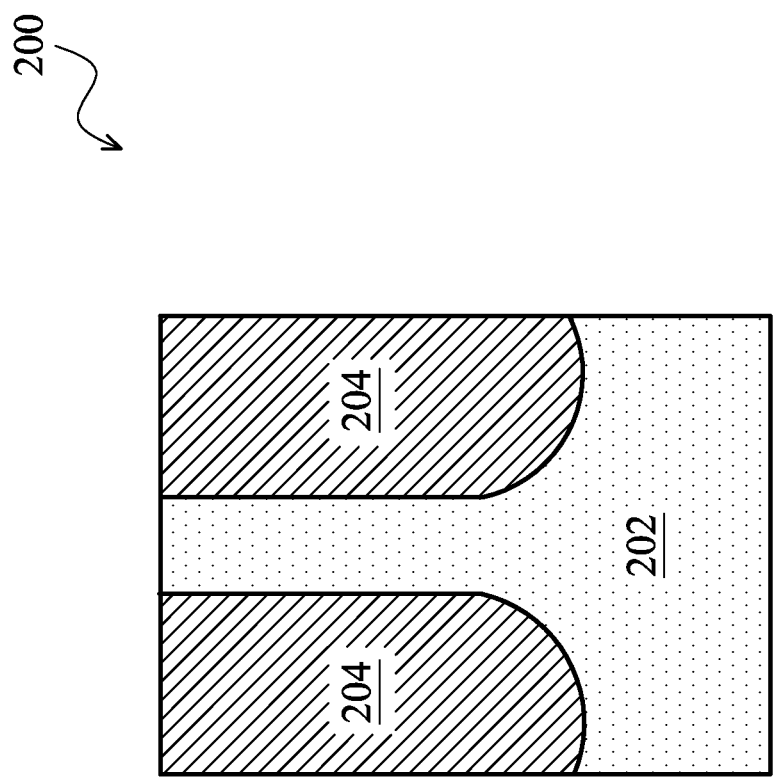
FIG. 3 illustrates a semiconductor device having a substrate with a first crystal orientation in accordance with an embodiment.

FIGS. 3-6 illustrate intermediate steps of fabricating the active region shown in FIG. 1 in accordance with an embodiment. FIG. 3 illustrates a semiconductor device having a substrate with a first crystal orientation in accordance with an embodiment. The semiconductor device 200 includes a substrate 202 and isolation regions 204 formed in the substrate 202. The formation process of the isolation regions 204 is similar to the formation process of the isolation regions shown in FIG. 2, and hence is not discussed herein to avoid repetition. The substrate 202 may be formed of silicon. In accordance with an embodiment, the substrate 202 may be of a <001> crystal orientation.

Figure 4:
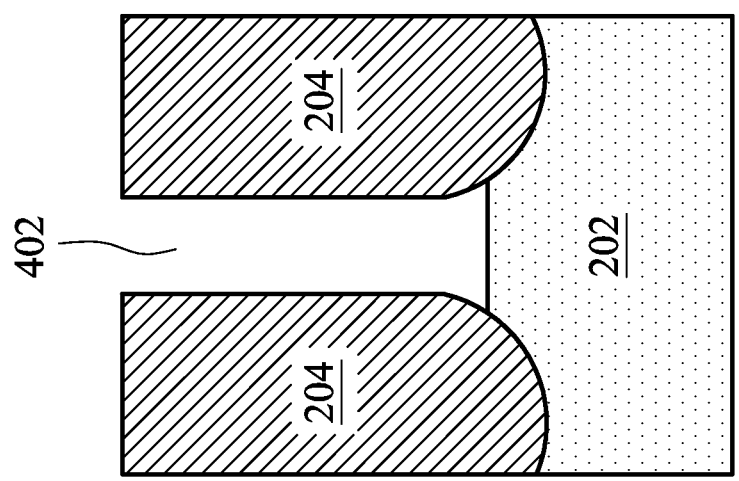
FIG. 4 illustrates a cross sectional view of the semiconductor device shown in FIG. 3 after an opening is formed in the substrate in accordance with an embodiment.

FIG. 4 illustrates a cross sectional view of the semiconductor device shown in FIG. 3 after an opening is formed in the substrate in accordance with an embodiment. A suitable silicon removal process such as an etching process may be employed to remove the upper portion of the substrate 202. As a result, an opening 402 is formed between the isolation regions 204. It should be noted that the silicon removal process is so controlled that the top surface of the remaining silicon substrate 202 is higher than the bottom surfaces of the isolation regions 204.

Figure 5:
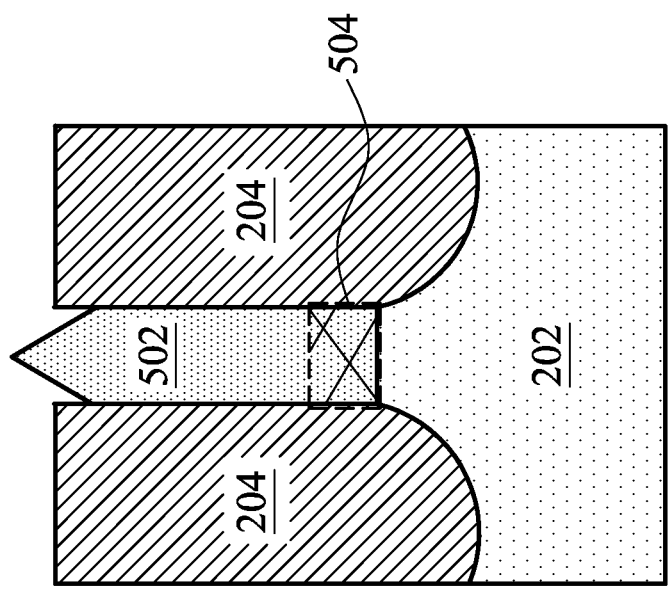
FIG. 5 illustrates a cross sectional view of the semiconductor device shown in FIG. 4 after a semiconductor region is grown in the opening over the substrate in accordance with an embodiment.

FIG. 5 illustrates a cross sectional view of the semiconductor device shown in FIG. 4 after a semiconductor region is grown in the opening over the substrate in accordance with an embodiment. A semiconductor region 502 having a different semiconductor material from the substrate 202 is grown in the opening. In accordance with embodiment, the semiconductor region 502 comprises germanium, which has a lattice constant different from that of the substrate 202, which may be formed of silicon. The semiconductor region 502 may be formed by a selective epitaxial growth (SEG) process.

In accordance with another embodiment, the semiconductor region 502 may comprise silicon germanium, which may be expressed as $Si_{1-x}Ge_x$, wherein x is the atomic percentage of germanium in silicon germanium, and may be greater than 0 and equal to or less than 1. When x is equal to 1, the semiconductor region 502 may be formed of pure germanium. In accordance with another embodiment, the semiconductor region 502 may comprise a compound semiconductor material comprising group III and group V elements, or a compound material comprising group II and group VI elements.

The process conditions for forming semiconductor region 502 are controlled so that the upper portion of the semiconductor region 502 is of a <111> crystal orientation. This may be achieved, for example, by increasing the growth temperature and reducing the pressure of the SEG process. In accordance with an embodiment, the growth temperature is between about 500° C. and about 650° C. The pressure of the SEG process may be as low as possible to allow the formation of the upper portion having a <111> crystal orientation. The pressure of the SEG process may be lower than about 0.13 torrs.

The lattice constant of germanium is greater than the lattice constant of silicon. There may be a 4.2% lattice mismatch between germanium and silicon. As a result, a plurality of threading dislocations may be generated during the SEG process. However, the threading dislocations may be trapped inside the trench. More particularly, the threading dislocations are trapped in a bottom region 504. When the semiconductor region 502 is grown increasingly higher, more and more threading dislocations are blocked by sidewalls of the trench. As a result, the upper portion (e.g., the triangular portion of the semiconductor region 502) is free of threading dislocations. In addition, the upper portion may be of a <111> crystal orientation.

Figure 6:
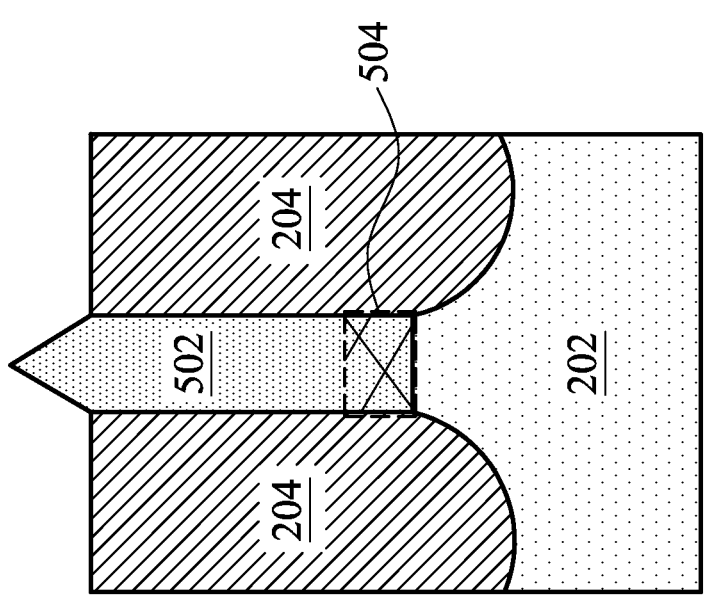
FIG. 6 illustrates the semiconductor device shown in FIG. 5 after an etching process is applied to the top surfaces of the isolation regions in accordance with an embodiment

FIG. 6 illustrates the semiconductor device shown in FIG. 5 after an etching process is applied to the top surfaces of the isolation regions in accordance with an embodiment. In order to form a multiple-gate transistor, the upper portions of the isolation regions are etched away. As shown in FIG. 6, the etching process is controlled such that the triangular upper portion of the active region is exposed. As described above with respect to FIG. 2, the upper portion of the semiconductor region 502 may function as a channel region of the multiple-gate transistor.

Figure 7:
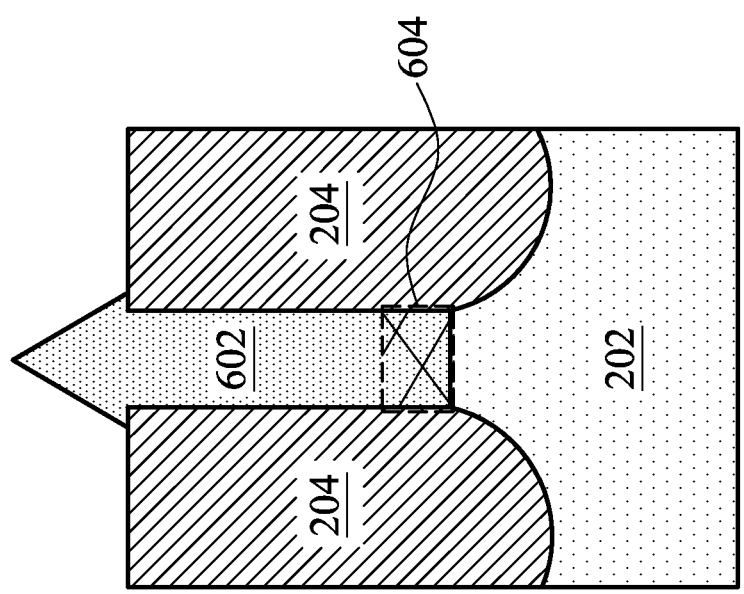
FIG. 7 illustrates a cross sectional view of the semiconductor device shown in FIG. 4 after a semiconductor layer is grown in the opening over the substrate in accordance with another embodiment.

FIG. 7 illustrates a cross sectional view of the semiconductor device shown in FIG. 4 after a semiconductor layer is grown in the opening over the substrate in accordance with another embodiment. The growth process of FIG. 7 is similar to that of FIG. 5 except that the semiconductor region 602 is over-grown. As a result, the triangular upper portion of the semiconductor 602 is formed over the top surfaces of the isolation regions 204. Therefore, it is not necessary to apply an etching process to the top surfaces of the isolation regions 204. Similar to the upper portion shown in FIG. 5, the upper portion of the semiconductor region 602 may be of a <111> crystal orientation.

Figure 8:
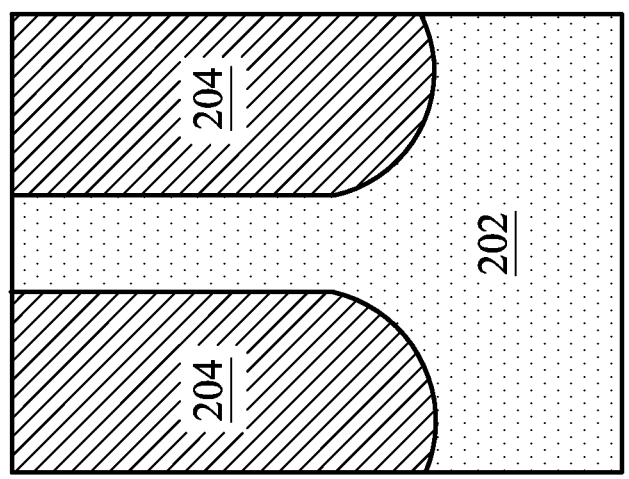
FIGS. 8-15 illustrate intermediate steps of fabricating the active region shown in FIG. 1 in accordance with another embodiment.
Figure 9:
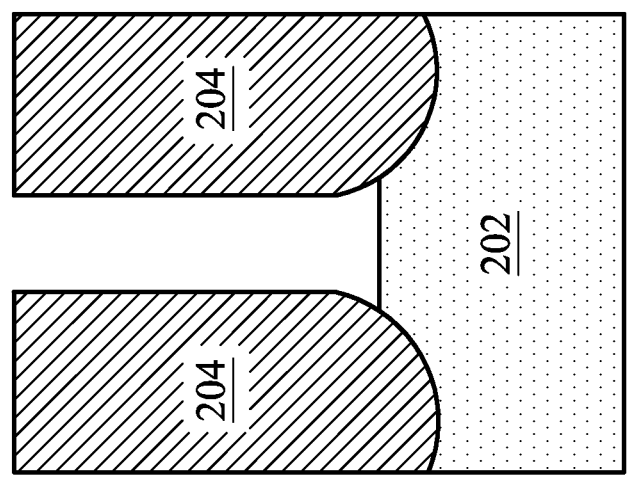
Figure 10:
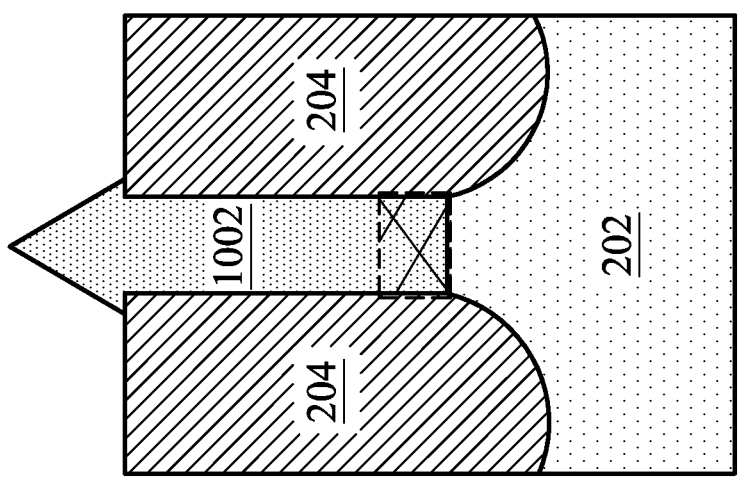

FIGS. 8-15 illustrate intermediate steps of fabricating the active region shown in FIG. 1 in accordance with another embodiment. The fabrication steps shown in FIGS. 8-10 are similar to the steps shown in FIGS. 3, 4 and 6 respectively, and hence are not discussed herein.

Figure 11:
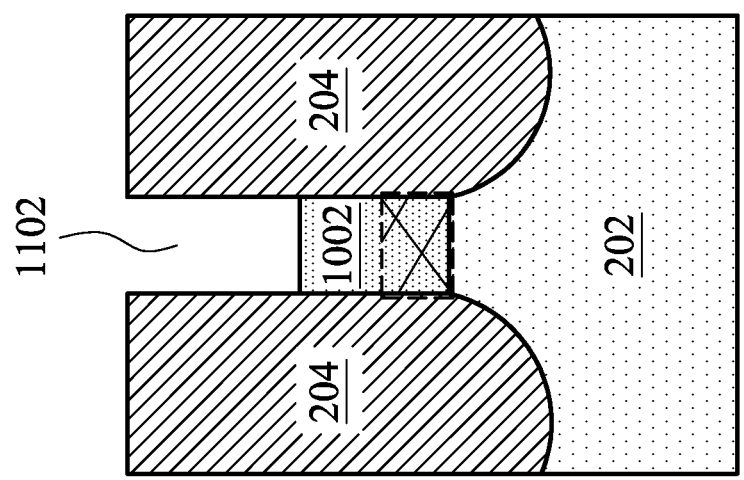

FIG. 11 illustrates the semiconductor device shown in FIG. 10 after a semiconductor removal process is applied to the upper portion of the active region of the semiconductor device. A chemical mechanical polish (CMP) process is performed to remove the upper portion of the semiconductor region 1002 so that the top surface of the semiconductor region 1002 is level with the top surfaces of the isolation regions 204. An etching process may be employed to remove the upper portion of the semiconductor region 1002. As a result, an opening 1102 is formed between the isolation regions 204. It should be noted that the removal process of material 1002 is so controlled that the top surface of the remaining semiconductor region 1002 is higher than the region having threading dislocations (the semiconductor region enclosed by a dashed rectangle).

Figure 12:
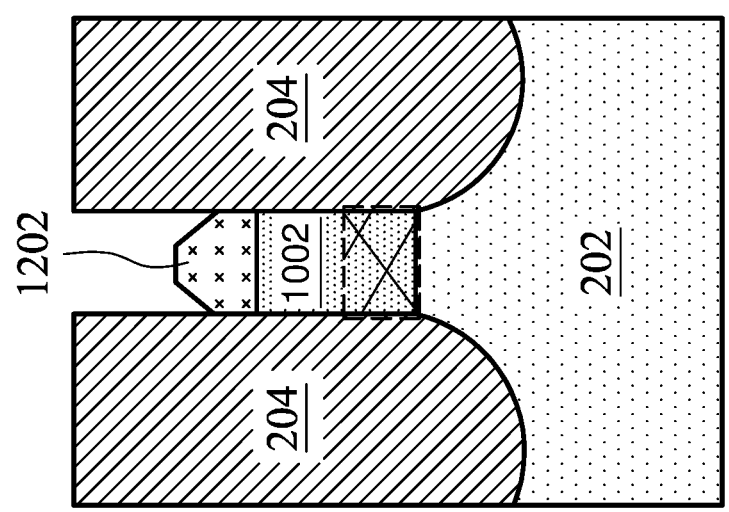
Figure 13:
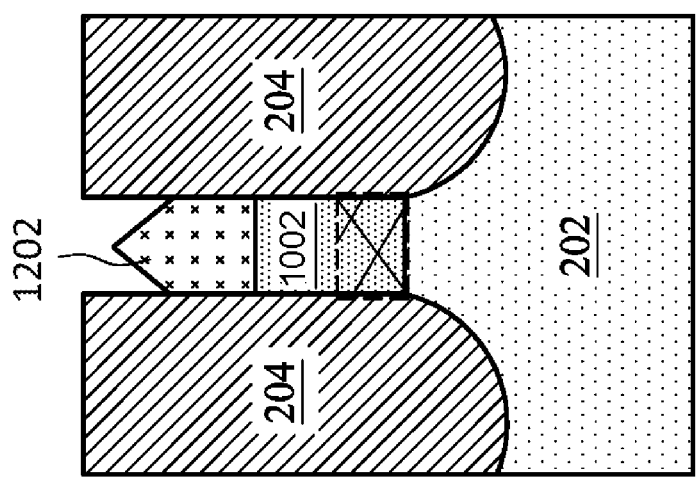

FIGS. 12 and 13 illustrate a second semiconductor region 1202 formed of a second semiconductor material is grown on the first semiconductor region 1002. The grown process such as temperature and pressure of the second semiconductor region is similar to that of the first semiconductor region, which has been described above with respect to FIG. 5.

Figure 14:
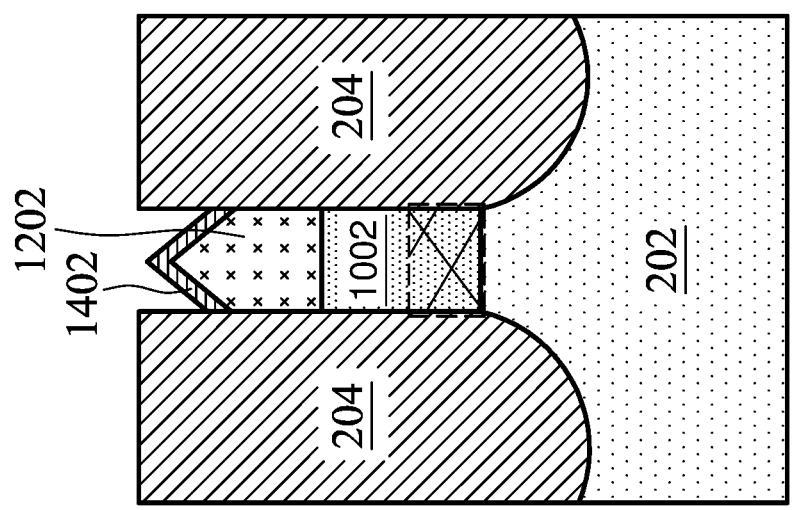

FIG. 14 illustrates a third semiconductor region 1402 is formed on top of the second semiconductor region 1202 in accordance with an embodiment. A third semiconductor material is grown on top of the second semiconductor material. The third semiconductor region 1402 is a thin film formed on top of the second semiconductor region 1202. It should be noted that the first semiconductor region 1002, the second semiconductor region 1202 and the third semiconductor region 1402 may be formed of different semiconductor materials such as group IV elements, group III-V compounds, group II-VI compounds and the like.

Figure 15:
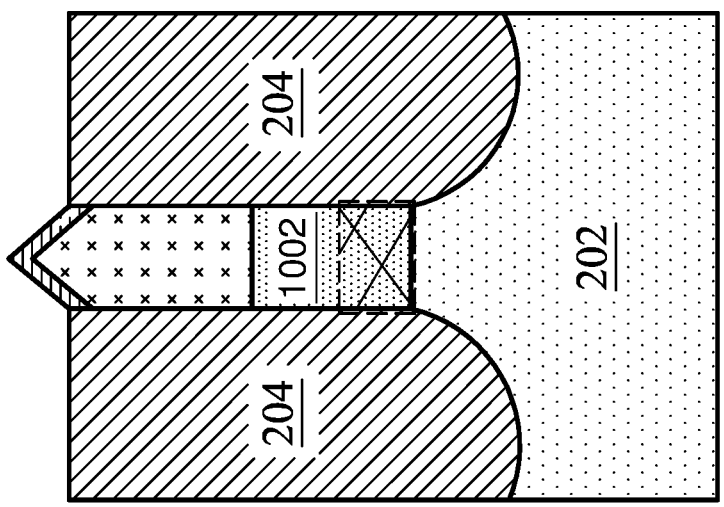
Figure 16:
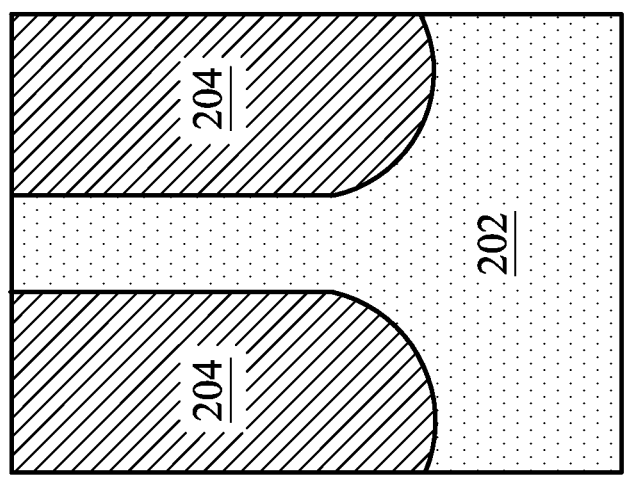
FIGS. 16-21 illustrate intermediate steps of fabricating the active region shown in FIG. 1 in accordance with yet another embodiment.
Figure 17:
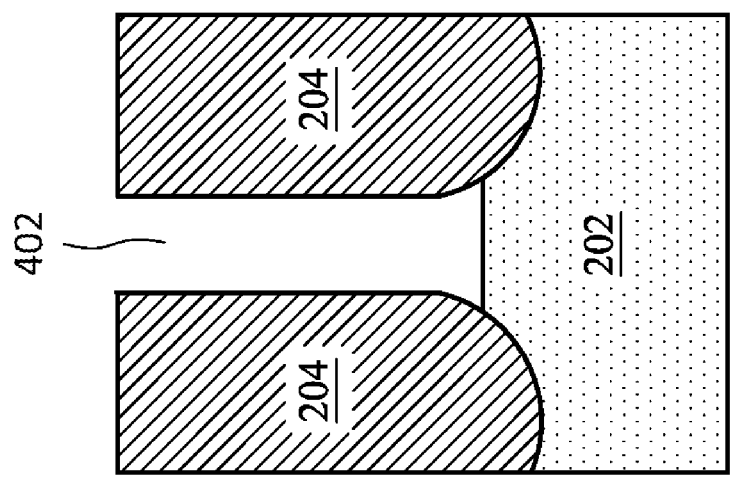
Figure 18:
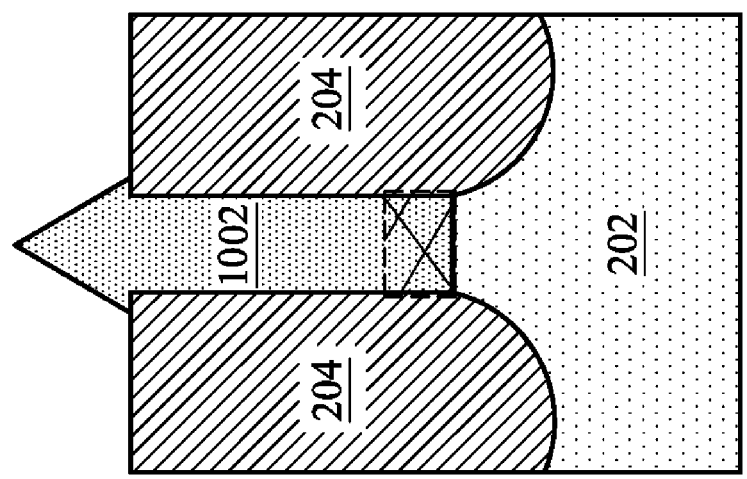
Figure 19:
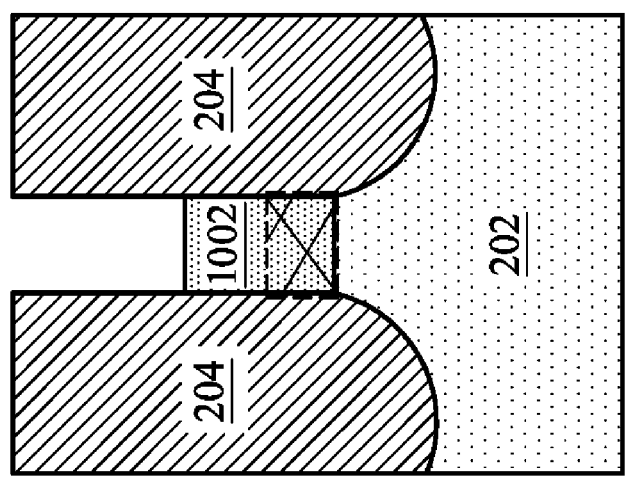
Figure 20:
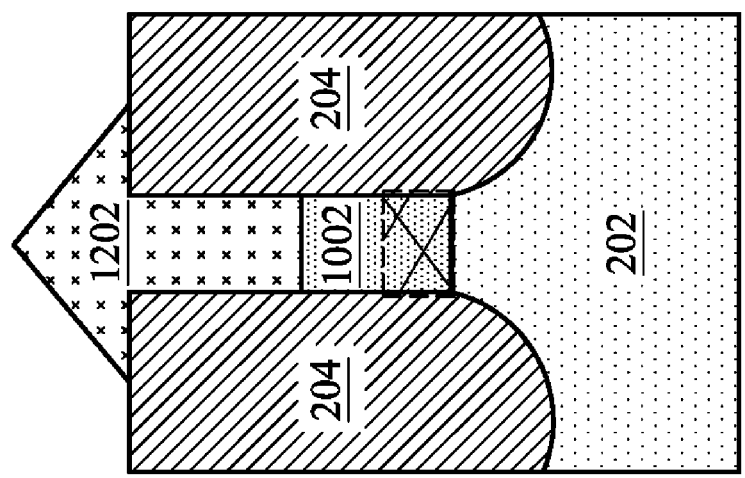
Figure 21:
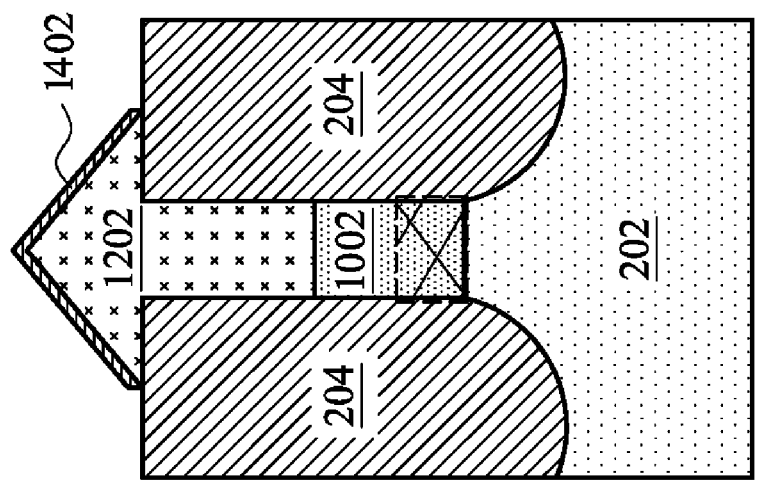

FIG. 15 illustrates upper portions of the isolation regions are etched away. The etching process is controlled such that the triangular upper portion of the semiconductor region is exposed. More particularly, as shown in FIG. 15, the third semiconductor region (the thin film) is exposed.

FIGS. 16-21 illustrate intermediate steps of fabricating the active region shown in FIG. 1 in accordance with yet another embodiment. The fabrication steps shown in FIGS. 16-21 are similar to the fabrication steps shown in FIGS. 8-15 except that the second semiconductor region 1202 is over-grown. As a result, a triangular upper portion is formed over the top surfaces of the isolation regions 204.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
etching away an upper portion of a substrate to form a trench between two adjacent isolation regions, wherein the substrate has a first crystal orientation and is formed of a first semiconductor material;
growing a first semiconductor region in the trench over the substrate, wherein the first semiconductor region is formed of a second semiconductor material and an upper portion of the first semiconductor region has a second crystal orientation;
planarizing the first semiconductor region and the isolation regions such that a top surface of the first semiconductor region is level with top surfaces of the isolation regions;
etching the first semiconductor region to form an opening between the isolation regions;
after the etching the first semiconductor region, growing a second semiconductor region over the first semiconductor region in the opening, the second semiconductor region grown until an upper portion of the second semiconductor region extends over and along the isolation regions, wherein the second semiconductor region is formed of a third semiconductor materials; and
growing a thin film on the upper portion of the second semiconductor region, wherein the thin film is formed of a fourth semiconductor material different from the second and third semiconductor materials.

2. The method of claim 1, wherein:
the first semiconductor region is formed through a first epitaxial growth process; and
the second semiconductor region is formed through a second epitaxial growth process.

3. The method of claim 1, wherein the etching the first semiconductor region comprises:
removing a portion of the first semiconductor region so that a top surface of the remaining first semiconductor region is lower than top surfaces of the isolation regions.

4. The method of claim 1, further comprising:
over-growing the first semiconductor region so that a triangular portion of the first semiconductor region is above top surfaces of the isolation regions.

5. The method of claim 1,
wherein the second semiconductor material, the third semiconductor material and the fourth semiconductor material are selected from the group consisting of group IV, group III-V and group II-VI semiconductor materials.

6. The method of claim 1, wherein:
after the step of growing the second semiconductor region over the first semiconductor region, an upper portion of the second semiconductor region is trapezoidal in shape.

7. The method of claim 1, wherein:
after the step of growing the second semiconductor region over the first semiconductor region, an upper portion of the second semiconductor region is triangular in shape.

8. A method comprising:
removing an upper portion of a substrate to form a trench between two adjacent isolation regions, wherein the substrate has a <001> crystal orientation;
growing a first semiconductor material in the trench to form a first semiconductor region, wherein an upper portion of the first semiconductor region has a <111> crystal orientation;
after applying a chemical mechanical polish process to the first semiconductor region, growing a second semiconductor material in the trench to form a second semiconductor region over the first semiconductor region; and
growing a thin film on top of the second semiconductor region, wherein the thin film is formed of a third semiconductor material.

9. The method of claim 8, further comprising:
over-growing the second semiconductor region so that a triangular portion of the second semiconductor region is above top surfaces of the isolation regions.

10. The method of claim 8, wherein:
the upper portion of the first semiconductor region is free of threading dislocations.

11. The method of claim 8, further comprising:
over-growing the first semiconductor region so that a triangular portion of the first semiconductor region is above top surfaces of the isolation regions;
removing the triangular portion of the first semiconductor region through the chemical mechanical polish process; and
removing an upper portion of the remaining first semiconductor region through an etching process.

12. The method of claim 11, wherein:
after the step of removing the triangular portion of the first semiconductor region through the chemical mechanical polish process, a top surface of the upper portion of the remaining first semiconductor region is level with top surfaces of the isolation regions.

13. The method of claim 8, wherein:
the first semiconductor material, the second semiconductor material and the third semiconductor material are selected from the group consisting of group IV, group III-V and group II-VI semiconductor materials.

14. A method comprising:
etching away a portion of a substrate having a first crystal orientation to form a trench between two adjacent isolation regions;
growing a first semiconductor region in the trench over the substrate, wherein an upper portion of the first semiconductor region is triangular in shape and has a second crystal orientation;
removing the upper portion of the first semiconductor region so that a top surface of the remaining first semiconductor region is level with top surfaces of the isolation regions;
removing a bottom portion of the first semiconductor region so that a top surface of the remaining first semiconductor region is lower than top surfaces of the isolation regions with an etching process;
growing a second semiconductor region over the first semiconductor region; and
growing a thin film on top of the second semiconductor region, the second semiconductor region disposed between the isolation regions and the thin film, wherein the first semiconductor region, the second semiconductor region, and the thin film are each formed from different semiconductor materials.

15. The method of claim 14, further comprising:
over-growing the second semiconductor region so that the upper portion of the second semiconductor region is above top surfaces of the isolation regions.

16. The method of claim 14, further comprising:
growing the second semiconductor region over the first semiconductor region, wherein a top surface of the second semiconductor region is lower than top surfaces of the isolation regions.

17. The method of claim 16, further comprising:
etching away upper portions of the isolation regions so that the upper portion of the second semiconductor region is above the top surfaces of the isolation regions.

18. The method of claim 17, wherein:
the upper portion of the second semiconductor region is triangular in shape.

19. The method of claim 14, wherein:
the substrate is formed of silicon; and
the first semiconductor region is formed of germanium.

20. The method of claim 14,
wherein the thin film is formed of a material selected from the group consisting of group IV, group III-V and group II-VI semiconductor materials.

* * * * *